United States Patent
Migliaccio

(10) Patent No.: US 6,541,990 B1
(45) Date of Patent: Apr. 1, 2003

(54) SYSTEMS FOR TESTING INTEGRATED CIRCUITS

(75) Inventor: James A. Migliaccio, Newbury Park, CA (US)

(73) Assignee: Skyworks Solutions, Inc., Newport Beach, CA (US)

(*) Notice: Subject to any disclaimer, the term of this patent is extended or adjusted under 35 U.S.C. 154(b) by 111 days.

(21) Appl. No.: 09/822,920

(22) Filed: Mar. 30, 2001

(51) Int. Cl.[7] .................... G01R 31/02; G01R 1/073
(52) U.S. Cl. .................... 324/755; 324/754; 324/761
(58) Field of Search ......................... 324/765, 754, 324/755, 757, 758, 762; 439/71

(56) References Cited

U.S. PATENT DOCUMENTS

| | | | | |
|---|---|---|---|---|
| 3,940,786 A | * | 2/1976 | Scheingold et al. | 174/52.4 |
| 4,329,642 A | * | 5/1982 | Luthi et al. | 206/509 |
| 4,554,505 A | * | 11/1985 | Zachry | 324/755 |
| 5,729,147 A | * | 3/1998 | Schaff | 324/755 |
| 6,094,057 A | * | 7/2000 | Hiruta et al. | 324/755 |

OTHER PUBLICATIONS

Aries Electronics, Inc., High Performance, RF Test Sockets (featuring the patented microstrip Contact), (month unavailable) 1997.

* cited by examiner

Primary Examiner—Ernest Karlsen
(74) Attorney, Agent, or Firm—Thomas, Kayden, Horstemeyer & Risley, LLP

(57) ABSTRACT

Testing systems are provided for testing a device under test (DUT), such as an integrated circuit. A preferred testing system includes a test array that incorporates a frame. The frame defines an aperture that is appropriately sized and shaped for receiving a DUT and mounts a testing probe that is adapted to extend into the aperture. The probe preferably is received within a recess formed along a bottom surface of the frame, thereby tending to enable the bottom surface of the frame to properly engage a surface to which it is to be mounted. Additionally, the probe may incorporate a configuration that tends to maintain the position of the probe relative to the frame and, thus, relative to the aperture. For instance, a shaped portion may be intermediately disposed along the length of the probe. So configured, when the shaped portion of the probe is received within a corresponding complimentary-shaped portion of its recess, the probe is substantially prevented from being urged along its longitudinal axis.

42 Claims, 5 Drawing Sheets

SYSTEMS FOR TESTING INTEGRATED CIRCUITS

BACKGROUND OF THE INVENTION

1. Technical Field

This invention generally relates to integrated circuits and, in particular, to testing systems that may be utilized for testing integrated circuits.

2. Related Art

The proliferation of integrated circuits (IC's) has lead to the development of numerous IC testing procedures. In accordance with a conventional testing procedure, an IC is temporarily mounted to a circuit assembly, such as a printed circuit board is (PCB), for example. So mounted, electrical communication is facilitated between at least one pad or pin of the IC and test equipment. Typically, the test equipment is configured to evaluate operational parameters of the IC. Thus, mounting of the IC to the circuit assembly enables testing of the IC in an operational environment as the pins of the IC electrically communicate with respective contacts or traces of the PCB as well as with the test equipment.

As is known, the ability of a particular testing procedure to provide accurate testing information relies, at least in part, on the ability of the procedure to facilitate proper electrical communication between the IC's to be tested and the test equipment. However, the structural demands associated with repetitive IC testing has, oftentimes, resulted in testing procedures and associated testing devices that provide less than desired performance characteristics.

SUMMARY

Briefly described, the invention relates to testing of integrated circuits (IC's). In this regard, some embodiments of the invention may be implemented as an IC testing system that includes a test array. The test array is configured to enable testing of a device under test (DUT), e.g., an IC, by facilitating electrical communication of the pins of the IC with test equipment. This is accomplished while the IC is electrically interconnected to a circuit assembly, e.g., a printed circuit board.

A representative example of the test array incorporates a frame, with the frame defining an aperture that is appropriately sized and shaped for receiving a DUT. The frame also mounts one or more testing probes that are adapted to extend into the aperture so as to be appropriately positioned for electrically engaging the DUT. The probes preferably are received within recesses formed along a bottom surface of the frame. This configuration tends to enable the bottom surface of the frame to properly engage a surface to which it is to be mounted, e.g., a surface of a PCB.

Engagement of the probes within the recesses also facilitates proper positioning of the probes. More specifically, one or more of the probes may incorporate a configuration that tends to maintain the position of the probes relative to the frame and, thus, relative to the aperture. For instance, one or more of the probes may include an S-shaped portion (S-shaped when viewed in a plan view), a circular portion (circular when viewed in a plan view), or various other shaped portions intermediately disposed along the length of each probe. So configured, when the shaped portion of the probe is received within a corresponding complimentary-shaped portion of its respective recess, the probe is substantially prevented from being urged along its longitudinal axis. More specifically, the various surfaces defining the shaped portion of the recess function as mechanical stops for substantially preventing movement of the probe.

In some embodiments of the testing system, controllers for providing a test signal to a DUT and receiving test information corresponding to the DUT are provided. Additionally, some embodiments incorporate a seating mechanism that is configured to engage a DUT with the test array so that the pins of the DUT electrically engage the test probes of the test array.

Other systems, methods, features and advantages of the invention will be or will become apparent to one with skill in the art upon examination of the following figures and detailed description. It is intended that all such additional system, methods, features and advantages be included within this description, be within the scope of the invention, and be protected by the accompanying claims.

BRIEF DESCRIPTION OF THE DRAWINGS

The components in the figures are not necessarily to scale, emphasis instead being placed upon clearly illustrating the principles of the invention. In the figures, like reference numerals indicate designate corresponding parts throughout the different views.

DETAILED DESCRIPTION

Figure 1:
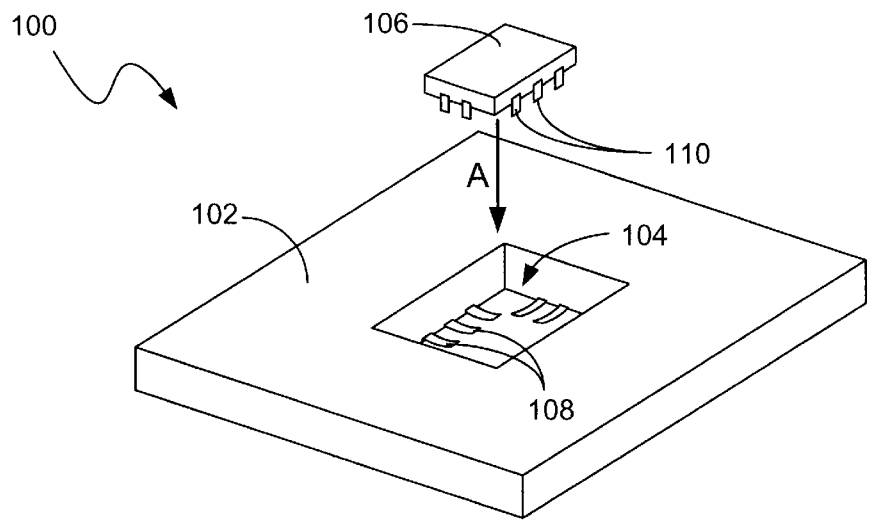
FIG. 1 is a perspective view of an embodiment of a test array of the invention depicted with a representative integrated circuit (IC) to be tested.

As shown in FIG. 1, a representative testing system of the invention includes a socket or test array 100. Test array 100 incorporates a frame 102, with the frame defining an aperture 104. Aperture 104 is appropriately sized and shaped for receiving a device under test (DUT), e.g., an integrated circuit (IC) 106. Frame 102 also mounts one or more testing probes 108. Probes 108 are adapted to extend outwardly from the frame and into aperture 104. So provided, when a DUT is inserted into the aperture, such as by directing the DUT toward the test array in direction A, electrical contact may be established between the various pads or pins 110 of the DUT and the various probes 108 of the test array.

Figure 2:
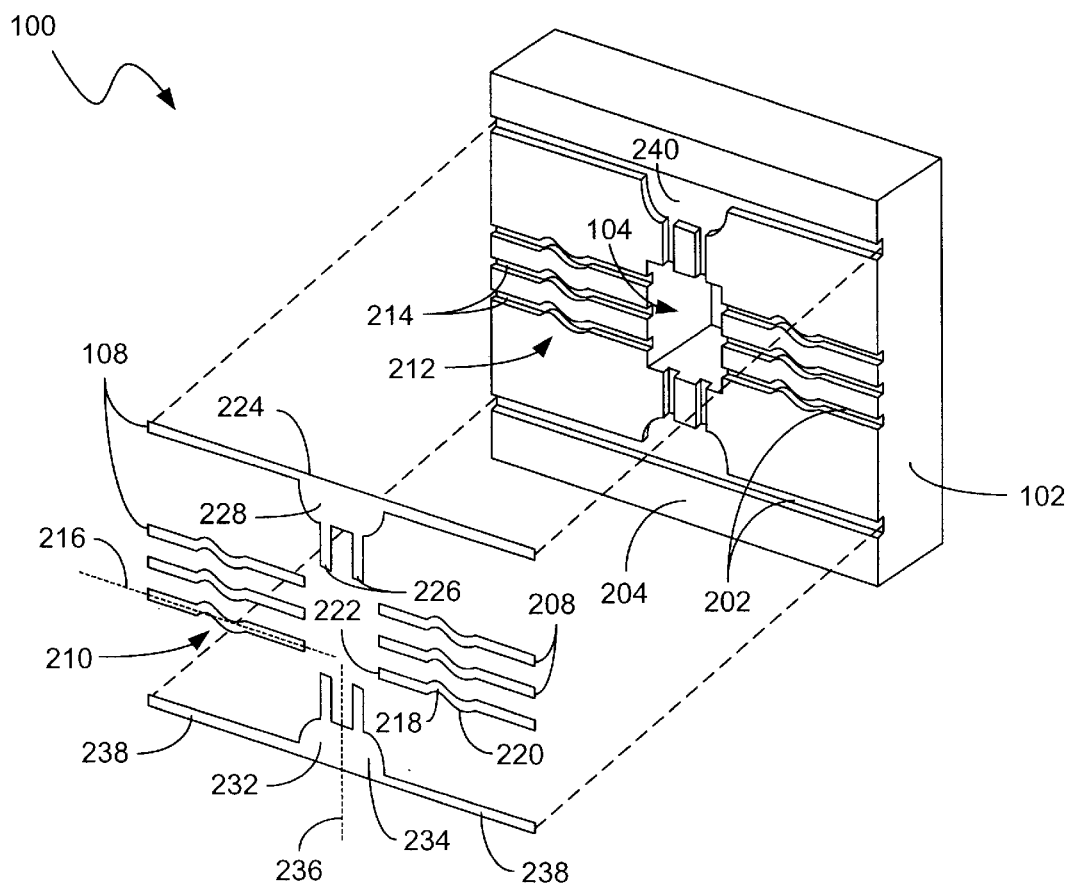
FIG. 2 is a partially-exploded, perspective view of the test array depicted in FIG. 1, showing detail of the testing probes and frame.
Figure 3:
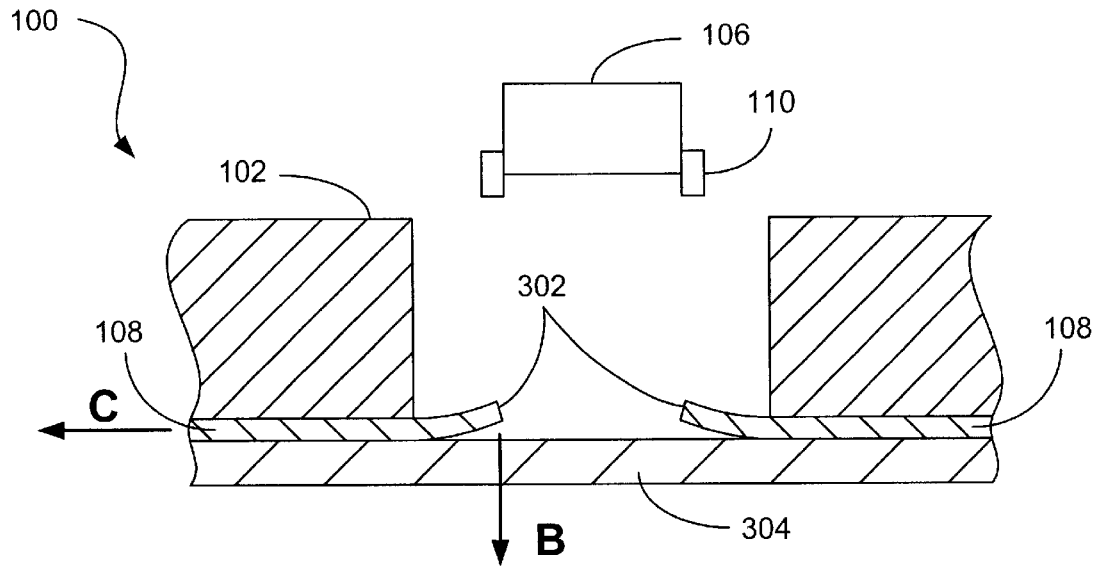
FIG. 3 is a partially cut-away, cross-sectional view of the test array depicted in FIGS. 1 and 2, showing detail of the testing probes.
Figure 4:
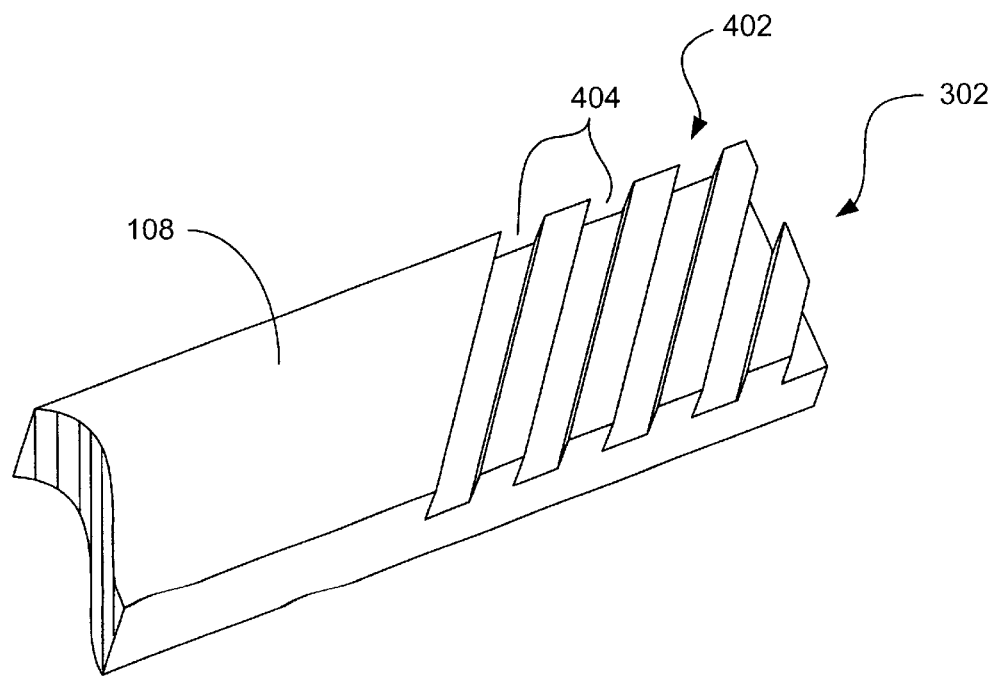
FIG. 4 is a partially cut-away, perspective view of a representative testing probe, showing detail of the probe end.

Referring now to FIGS. 2 through 4, an embodiment of test array 100 will be described in greater detail. As depicted in FIG. 2, probes 108 preferably are received within recesses 202 formed along a bottom surface 204 of frame 102. Engagement of the probes within the recesses enables bottom surface 204 to properly engage a surface to which it is to be mounted, e.g., a surface of a PCB, for example.

Engagement of the probes 108 within recesses 202 also facilitates proper positioning of the probes. More specifically, one or more of the probes may incorporate a configuration that tends to maintain the position of the probes relative to frame 102 and, thus, relative to aperture 104. For instance, several of the probes, i.e., probes 208, each include an S-shaped portion 210 (S-shaped when viewed in a plan view). Preferably, the S-shaped portion is intermediately disposed along the length of each probe although various other orientations may be utilized. So configured, when the S-shaped portion 210 of the probe is received within a corresponding complimentary-shaped portion 212 of its respective recess 214, the probe is substantially prevented from being urged along its longitudinal axis, e.g., axis 216. More specifically, as the laterally extending portions 218 and 220 of a probe engage within portion 212 of its recess, the various surfaces defining portion 212 function as mechanical stops for substantially preventing movement of the probe.

As shown in FIG. 2, various configurations of probes may be provided with a test array. For example, in contrast to probes 208 (each of which includes one probe end, e.g., probe end 222), probes that include multiple probe ends may be utilized. In particular, probes 224 each may include multiple probe ends 226. Preferably, at each probe 224, probe ends 226 extend from an intermediate portion 228 that includes laterally extending portions 232 and 234. Laterally extending portions 232 and 234 extend laterally, outwardly from a longitudinal axis 236 of the probe ends 226. Unlike probes 208, however, each probe 224 may be provided with probe stems 238 that are configured to extend laterally from the intermediate portion of the probe. So provided, engagement of a probe 224 within its recess 240 may substantially prevent movement of the probe relative to the frame 102. Probes 224 also may provide the additional benefit of enabling electrical interconnection between a DUT and a component/element displaced from the longitudinal axes of their respective probe ends 226.

In a typical testing arrangement, test array 100 may be positioned upon a printed circuit board (PCB), or any other suitable circuit assembly, so that when a DUT is electrically engaged with the probes of the test array, the DUT also electrically communicates with the PCB. So configured, the probes of the test array may facilitate electrical communication of the DUT with suitable test equipment while allowing the DUT to electrically communicate with one or more components of the PCB, as if in an operational environment. Although not shown, positioning and affixation of the test array to a PCB or other suitable surface preferably is facilitated by mechanical fasteners that allow the test array to be removably attached to a surface during testing.

Tendency of a probe to be urged along its longitudinal axis typically is initiated by engaging the probe with a DUT. For example, as depicted in FIG. 3, embodiments of the test array 100 may include probes 108 incorporating upwardly curved distal ends 302. In particular, the distal ends may be curved upwardly and away from a surface to which the test array is mounted, e.g., the upper surface of PCB 304. Thus, when DUT 106 engages test array 100, engagement of the pads 10 of the DUT with the distal ends 302 of the probes tends to both downwardly deflect the distal ends of the probes, e.g., in direction B, and outwardly urge the probes, e.g., in direction C, from the DUT.

As depicted in FIG. 4, embodiments of probe 108 may incorporate a rasp 402. Although various configurations may be utilized, a preferred rasp includes a spaced arrangement of grooves 404. Various numbers and arrangements of grooves may be provided, such as an angular arrangement (the grooves are angled relative to a transverse axis of the probe, depicted in FIG. 4), a parallel arrangement (the grooves are substantially parallel to a transverse axis of the probe, not shown), etc.. Preferably, rasp 402 is arranged at the distal end 302 of the probe so that, when the pins of a DUT engage the probe ends and downwardly deflect the ends as previously described, a sliding motion between the pins of the DUT and the probe ends occurs. In those embodiments incorporating the rasp 402, the aforementioned sliding motion of the DUT pins against the probe ends allows the various surfaces of the rasp to remove a portion of the material of the pins. By removing a portion of the material of the pins in the aforementioned manner, a superior electrical contact between the pins and the probes of the test array may be achieved as surface corrosion and/or other electrical communication-inhibiting material(s) may be removed.

Figure 5:
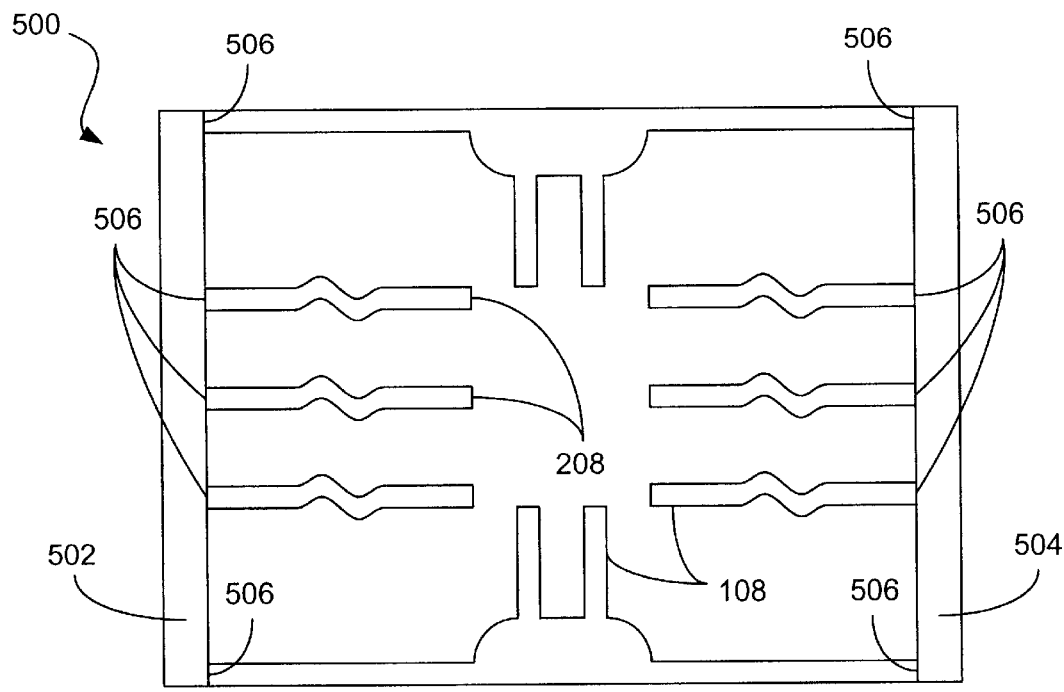
FIG. 5 is a plan view of the probe assembly of FIGS. 1–3, showing a pre-installed configuration of the probe assembly.
Figure 6:
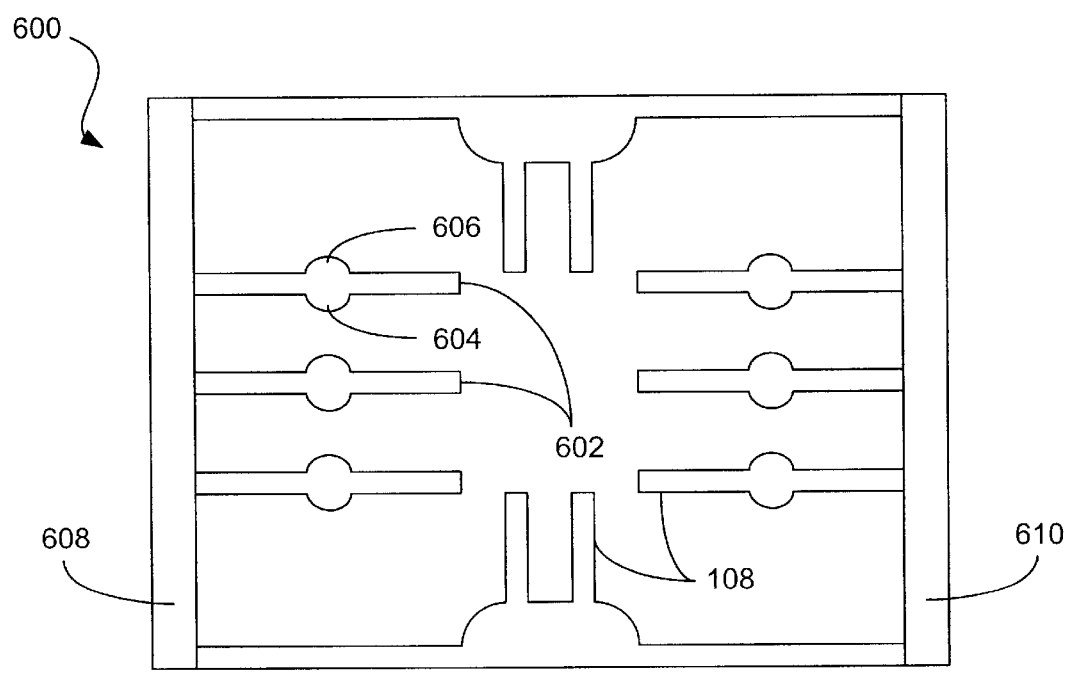
FIG. 6 is a plan view of an alternative embodiment of a probe assembly, showing a pre-installed configuration of the probe assembly.

FIGS. 5 and 6 depict representative probe assemblies 500 and 600, respectively. As shown in FIG. 5, probes 108 may be affixed, at least initially, to each other so as to form a unitary structure. Probe assembly 500 preferably includes break-away bars, e.g., bars 502 and 504, that are adapted to maintain probes 108 in appropriate positions relative to each other during assembly of a test array. After the probes are appropriately mounted to a frame of a test array, e.g., frame 102 depicted in FIG. 2, the break-away bars may be removed. Removal of the break-away bars may be facilitated by bending the bars until structural failure occurs at joints 506 formed between the bars and the various probes. Although probe assemblies are depicted in the accompanying figures as including ten probes, it should be noted that various other numbers and configurations of probes may be utilized, with such other numbers and configurations being considered well within the scope of this invention.

Referring to FIG. 6, a representative probe assembly 600 will now be described in detail. In contrast to the S-shaped probes 208 depicted in FIG. 2, for example, probes 602 of this embodiment may incorporate laterally extending portions 604 and 606 that preferably are symmetrical and arranged in an opposing relationship with each other. For instance, laterally extending portions 604 and 606 form a generally circular configuration (as viewed in plan view). Portions 604 and 606 are adapted to be received in complimentary-shaped recesses (not shown) of their respective frame (also not shown). So provided, and in similar fashion to the embodiment depicted in FIG. 2, the probes 602 are adapted to facilitate and maintain proper positioning during testing of DUT's. Probe assembly 600 also preferably includes break-away bars, e.g., bars 608 and 610, that are adapted to maintain probes 602 in appropriate positions relative to each other during assembly of a test array.

Probes utilized by this invention are capable of being formed of various materials. For example, the probes may be formed of a copper alloy core with a thin nickel diffusion layer thereon. Since nickel may have a tendency to develop microcracks at increased thicknesses, in some embodiments, a layer of gold may be applied over the nickel.

Figure 7:
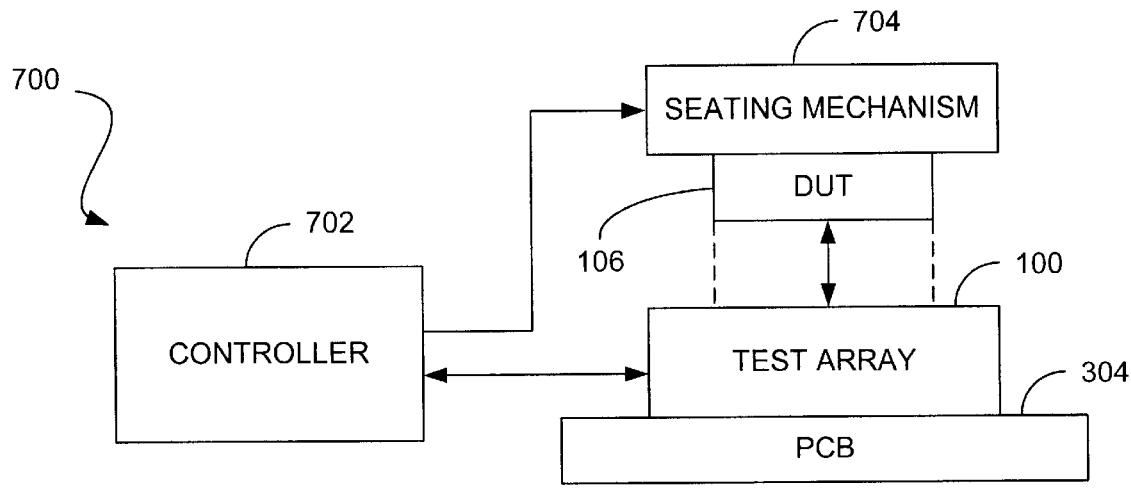
FIG. 7 is a schematic diagram of an embodiment of a testing system of the invention.

FIG. 7 schematically depicts an embodiment of a testing system 700 that incorporates the test array 100. As shown in FIG. 7, test system 700 includes a test array 100 that is adapted to engage a DUT 106. A controller 702 also is provided. In some embodiments, the controller electrically communicates with automated DUT positioning equipment, such as a conventional seating mechanism 704, that is adapted to place a DUT in electrical engagement with the test array 100 for testing and to remove the DUT from the test array once testing is completed. In particular, in response to an appropriate signal(s) from controller 702, seating mechanism 104 engages the test array with DUT 106, i.e., the pins of the DUT are positioned so as to electrically communicate with the probes of the test array. Once so positioned, the configuration of the probes of the test array facilitates electrical communication of the pins of the DUT with various traces of PCB 304, thereby enabling the DUT to be tested in an operational setting. Controller 702 also is adapted to electrically communicate with test array 100 and, more specifically, with the probes of the test array. Thus, controller 102 is suited for facilitating various testing functionality of the testing system 700.

Embodiments of the controller of this invention may be implemented in hardware, software, firmware, or a combination thereof. In some embodiments, however, the controller is implemented as a software package, which can be adaptable to run on different platforms and operating systems, in combination with various other components, as shall be described further. In particular, an embodiment of the controller, which comprises an ordered listing of executable instructions for implementing logical functions, can be embodied in any computer-readable medium for use by or in connection with an instruction execution system, apparatus, or device, such as a computer-based system, processor-containing system, or other system that can fetch the instructions from the instruction execution system, apparatus, or device, and execute the instructions.

In the context of this document, a "computer-readable medium" can be any means that can contain, store, communicate, propagate or transport the program for use by or in connection with the instruction execution system, apparatus, or device. The computer readable medium can be, for example, but is not limited to, an electronic, magnetic, optical, electromagnetic, infrared, or semi-conductor system, apparatus, device, or propagation medium. More specific examples (a non-exhaustive list) of the computer-readable medium may include the following: an electrical connection (electronic) having one or more wires, a portable computer diskette (magnetic), a random access memory (RAM) (magnetic), a read-only memory (ROM) (magnetic), an erasable, programmable, read-only memory (EPROM or Flash memory) (magnetic), an optical fiber (optical), and a portable compact disk read-only memory (CDROM) (optical). Note that the computer-readable medium could even be paper or another suitable medium upon which the program is printed, as the program can be electronically captured, via for instance, optical scanning of the paper or other medium, then compiled, interpreted, or otherwise processed in a suitable manner, if necessary, and then stored in a computer memory.

Figure 8:
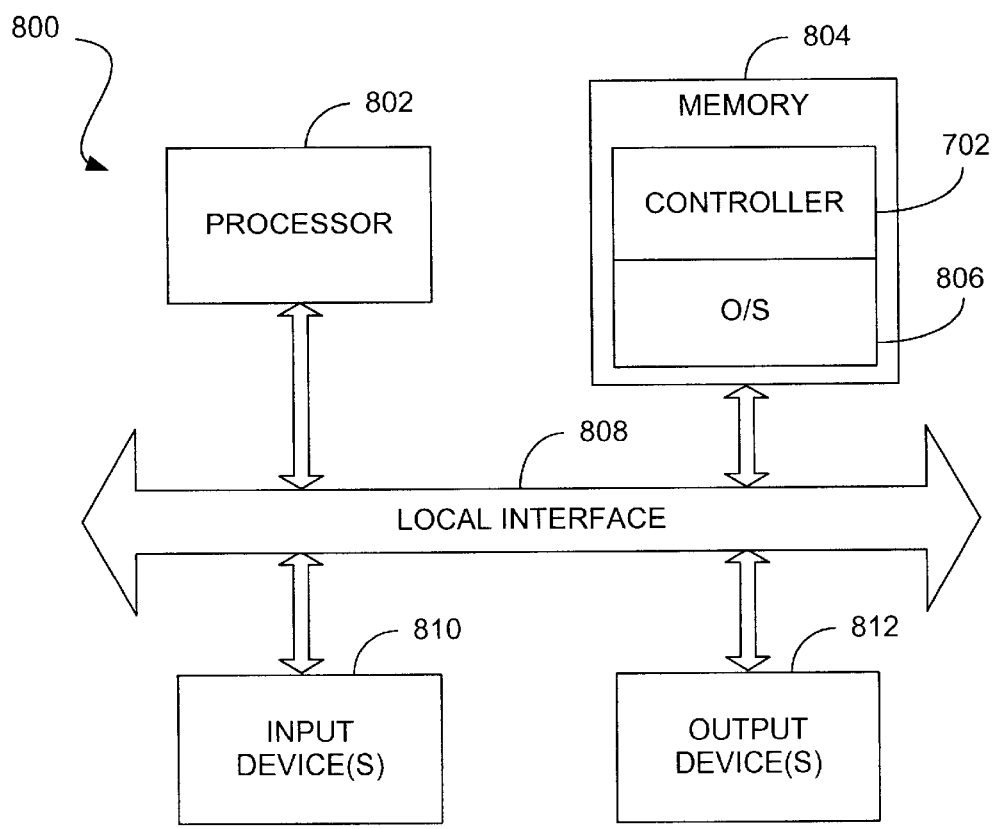
FIG. 8 is a schematic diagram depicting a representative computer or processor-based system that may facilitate functionality of a controller of the invention.

FIG. 8 illustrates a typical computer or processor-based system 800 which may facilitate operability of the controller of this invention. As shown in FIG. 8, a computer system 800 generally comprises a processor 802 and a memory 804 with an operating system 806. Memory 804 may be any combination of volatile and nonvolatile memory elements, such as random access memory or read only memory. The processor 802 accepts instructions and data from memory 804 over a local interface 808, such as a bus(es). The system also includes an input device(s) 810 and an output device(s) 812. Examples of input devices may include, but are not limited to, a serial port, a scanner, or a local access network connection. Examples of output devices may include, but are not limited to, a video display, a Universal Serial Bus, or a printer port. Generally, this system may run any of a number of different platforms and operating systems including, but not limited to, HP-UX™, Linux™, Unix™, Sun Solaris™ or Windows NT™ operating systems. The controller of this invention, the functions of which shall be described next, resides in memory 804 and is executed by the processor 802.

Figure 9:
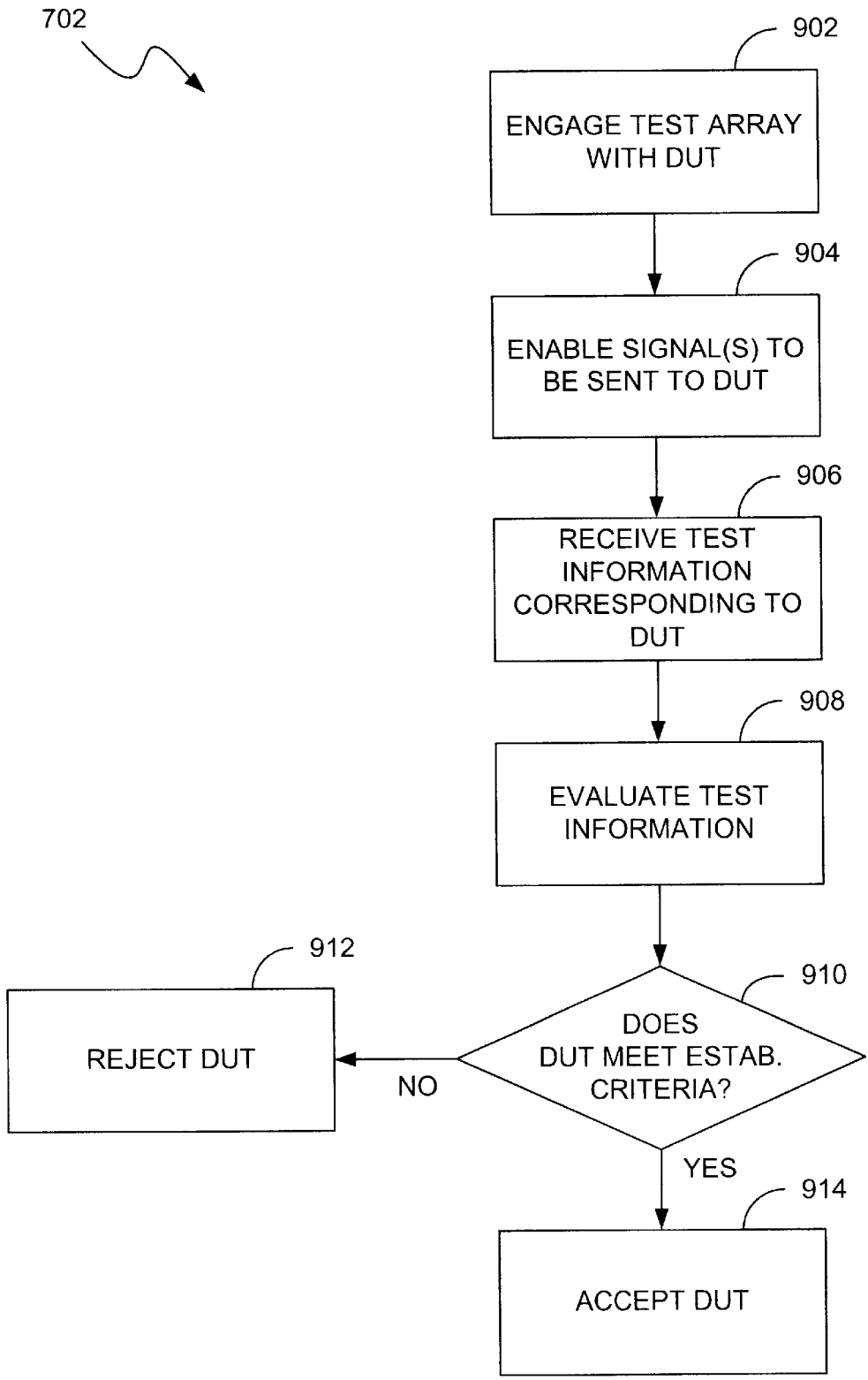
FIG. 9 is a flow chart depicting functionality of the controller depicted in FIG. 8.

The flowchart of FIG. 9 shows the functionality of an implementation of the controller depicted in FIG. 8. In this regard, each block of the flowchart represents a module segment or portion of code that comprises one or more executable instructions for implementing the specified logical function or functions. It should also be noted that in some alternative implementations the functions noted in the various blocks may occur out of the order depicted in FIG. 9. For example, two blocks shown in succession in FIG. 9 may, in fact, be executed substantially concurrently where the blocks may sometimes be executed in the reverse order depending upon the functionality involved.

Referring now to FIG. 9, controller functionality or method 702 may be construed as beginning at block 902 where engagement of a DUT with a test array is enabled. For instance, the controller may provide a control signal(s) to a seating mechanism that is adapted to properly engage the pins of the DUT with the probes of the test array. In other embodiments, however, positioning of the DUT may be accomplished without utilizing the controller. As mentioned before, superior electrical contact between the pins of the DUT and the probes of the test array may be facilitated by the use of probes that incorporate rasps.

Once the DUT is appropriately engaged with the test array, the process may proceed to block 904 where a test signal(s) are provided to the DUT. Proceeding to block 906, information corresponding to the DUT and, more specifically, test information from the DUT may be received. In particular, the test information may be provided from the DUT in response to receiving the test signal(s). At block 908, the test information preferably is evaluated and, in block 910, a determination may be made as to whether the DUT meets established testing criteria. If it is determined that the DUT has not met the established testing criteria, the process may proceed to block 912 where the DUT may be rejected or, alternatively, may be subjected to further testing and/or reworking. If, however, it is determined that the DUT meets the established testing criteria, the DUT may be accepted (block 914).

While various embodiments of the invention have been described, it will be apparent to those of ordinary skill in the art that many more embodiments and implementations are possible that are within the scope of this invention.

What is claimed is:

1. A system for testing an integrated circuit, the integrated circuit having a plurality of pins, each of the pins being configured to electrically communicate with a contact of a circuit assembly, the system comprising:

a frame defining an aperture and having a bottom surface, the bottom surface being configured to engage a circuit assembly and having a plurality of recesses formed therein, each of the recesses communicating with the aperture; and a plurality of test probes engaging the bottom surface, each of the probes being received, at least partially, within one of the recesses, each of the probes having a proximal end, a distal end, and an intermediate portion disposed between the proximal end and distal end, each distal end extending, at least partially, into the aperture such that each probe is engagable by a pin of an integrated circuit inserted into the aperture, at least of one of the probes having a longitudinal axis and a first laterally extending portion disposed along the intermediate portion of the probe, the first laterally extending portion engaging a complimentary-shaped portion of the recess engaged by the probe, the first laterally extending portion of the probe and the complimentary-shaped portion of the recess being configured to reduce movement of the probe along the longitudinal axis of the probe as the pin of the integrated circuit engages the distal end of the probe.

2. The system of claim 1, wherein the probe has a second laterally extending portion, the first laterally extending portion and the second laterally extending portion residing on opposing sides of the longitudinal axis of the probe.

3. The system of claim 1, wherein the distal end of the probe has a rasp formed thereon, the rasp being configured to abrade an exterior surface of at least a portion a pin.

4. The system of claim 1, wherein the distal end of the probe has means for abrading at least a portion a pin thereby promoting electrical contact between the probe and the pin.

5. The system of claim 1, wherein the probe comprises nickel and a layer of gold applied over the nickel.

6. The system of claim 1, further comprising a second probe having first and second probe ends extending outwardly from an intermediate portion, and wherein the frame has a second recess for receiving the second probe, the first and second probe ends being configured to extend, at least partially, into the aperture.

7. The system of claim 1, wherein the distal end of each of the probes is curved upwardly from the bottom surface and is adapted to deflect downwardly toward the bottom surface in response to engagement with a pin of an integrated circuit.

8. The system of claim 2, wherein the first laterally extending portion and the second laterally extending portion, as viewed in plan, are formed in an S-shaped configuration.

9. The system of claim 2, wherein the first laterally extending portion and the second laterally extending portion, as viewed in plan, are formed in a circular configuration.

10. The system of claim 5, wherein the probe comprises a copper alloy core with the nickel being formed upon the core as a diffusion layer.

11. The system of claim 6, wherein the first and second ends of the second probe extend substantially parallel to a longitudinal axis of the second probe, the second end having first and second stems extending outwardly from the intermediate portion substantially parallel to a transverse axis of the second probe.

12. A system for testing an integrated circuit, the integrated circuit having a plurality of pins, each of the pins being configured to electrically communicate with a contact of a circuit assembly, the system comprising:

a test array having a frame and a plurality of test probes, the frame defining an aperture and having a bottom surface, the bottom surface being configured to engage a circuit assembly and having a plurality of recesses formed thereon, each of the recesses communicating with the aperture, the plurality of test probes engaging the bottom surface of the frame, each of the probes being received, at least partially, within one of the recesses, each of the probes having a proximal end, a distal end and an intermediate portion disposed therebetween, each distal end extending, at least partially, into the aperture such that each probe is engagable by a pin of an integrated circuit inserted into the aperture, at least of one of the probes having a longitudinal axis and a first laterally extending portion disposed along the intermediate portion of the probe, the first laterally extending portion engaging a complimentary-shaped portion of the recess engaged by the probe, the first laterally extending portion of the probe and the complimentary-shaped portion of the recess being configured to reduce movement of the probe along the longitudinal axis of the probe as the pin of the integrated circuit engages the distal end of the probe.

13. The system of claim 12, further comprising:

a controller configured to electrically communicate with the test probes of the test array, the controller being further configured to provide a test signal to an integrated circuit electrically engaged with the test probes such that, in response thereto, the controller receives test information corresponding to the integrated circuit.

14. The system of claim 12, wherein the frame is configured to removably engage the circuit assembly.

15. The system of claim 12, wherein the probe has a second laterally extending portion, the first laterally extending portion and the second laterally extending portion residing on opposing sides of the longitudinal axis of the probe.

16. The system of claim 12, wherein the distal end of the probe has a rasp formed thereon, the rasp being configured to abrade an exterior surface of at least a portion a pin.

17. The system of claim 12, wherein the distal end of the probe has means for abrading at least a portion a pin thereby promoting electrical contact between the probe and the pin.

18. The system of claim 12, wherein the probe comprises nickel and a layer of gold applied over the nickel.

19. The system of claim 12, further comprising a second probe having first and second probe ends extending outwardly from an intermediate portion, and wherein the frame has a second recess for receiving the second probe, the first and second probe ends being configured to extend, at least partially, into the aperture.

20. The system of claim 12, wherein the distal end of each of the probes is curved upwardly from the bottom surface and is adapted to deflect downwardly toward the bottom surface in response to engagement with a pin of an integrated circuit.

21. The system of claim 12, further comprising:

a seating mechanism configured to engage the test array with an integrated circuit such that the pins of the integrated circuit electrically engage the test probes of the test array.

22. The system of claim 15, wherein the first laterally extending portion and the second laterally extending portion, as viewed in plan, are formed in an S-shaped configuration.

23. The system of claim 15, wherein the first laterally extending portion and the second laterally extending portion, as viewed in plan, are formed in a circular configuration.

24. The system of claim 18, wherein the probe comprises a copper alloy core with the nickel being formed upon the core as a diffusion layer.

25. The system of claim 19, wherein the first and second ends of the second probe extend substantially parallel to a longitudinal axis of the second probe, the second end having first and second stems extending outwardly from the intermediate portion substantially parallel to a transverse axis of the second probe.

26. A method for testing an integrated circuit comprising:

providing a test array having a frame and a plurality of test probes, the frame defining an aperture and having a bottom surface, the bottom surface being configured to engage a circuit assembly, each of the probes having a proximal end, a distal end and an intermediate portion disposed therebetween, each distal end extending, at least partially, into the aperture such that each probe is engagable by a pin of an integrated circuit inserted into the aperture, at least of one of the probes having a longitudinal axis;

providing an integrated circuit to be tested;

electrically engaging a probe of the test array with a pin of the integrated circuit;

substantially preventing movement of the probe along the longitudinal axis of the probe as the pin of the integrated circuit engages the distal end of the probe; and testing the integrated circuit, wherein providing a test array comprises providing at least one of the probes with a first laterally extending portion disposed along the intermediate portion of the probe, and at least one of the recesses with a portion complimentary-shaped with respect to the first laterally extending portion of the probe; and wherein substantially preventing movement of the probe along the longitudinal axis of the probe comprises engaging the first laterally extending portion of the probe within the complimentary-shaped portion of the recess.

27. The method of claim 26, wherein providing a test array comprises providing a test array with the bottom surface having a plurality of recesses formed thereon, each of the recesses communicating with the aperture, and each of the probes being received, at least partially, within one of the recesses.

28. The method of claim 26, wherein electrically engaging a probe of the test array with a pin of the integrated circuit comprises abrading at least a portion of an exterior surface of the pin with the a rasp formed at the distal end of the probe.

29. The method of claim 26, wherein providing a test array comprises providing at least one of the probes with a first laterally extending portion disposed along the intermediate portion of the probe and a second laterally extending portion disposed along the intermediate portion of the probe, and at least one of the recesses with a portion complimentary-shaped with respect to the first and second laterally extending portions of the probe; and wherein substantially preventing movement of the probe along the longitudinal axis of the probe comprises engaging the first and second laterally extending portions of the probe within the complimentary-shaped portion of the recess.

30. The method of claim 26, further comprising:

enabling a first test signal to be transmitted to the integrated circuit via at least one of the probes of the test array;

receiving information corresponding to the integrated circuit in response to the signal;

evaluating the information.

31. The method of claim 26, wherein electrically engaging a probe of the test array with a pin of the integrated circuit comprises:

providing a seating mechanism configured to engage an integrated circuit with the test array such that the pins of the integrated circuit electrically engage the test probes of the test array; and electrically engaging the test probes of the test array with the pins of the integrated circuit by utilizing the seating mechanism.

32. The method of claim 26, wherein the distal end of each of the probes is curved upwardly from the bottom surface of the frame and is adapted to deflect downwardly toward the bottom surface in response to engagement with a pin of an integrated circuit.

33. The method of claim 29, wherein the probe comprises nickel and a layer of gold applied over the nickel.

34. The method of claim 29, wherein a second of the probes has first and second probe ends extending outwardly from an intermediate portion, the first and second probe ends being configured to extend, at least partially, into the aperture.

35. The method of claim 29, wherein the first laterally extending portion and the second laterally extending portion, as viewed in plan, are formed in an S-shaped configuration.

36. The method of claim 29, wherein the first laterally extending portion and the second laterally extending portion, as viewed in plan, are formed in a circular configuration.

37. The method of claim 34, wherein the probe comprises a copper alloy core with the nickel being formed upon the core as a diffusion layer.

38. The method of claim 34, wherein the first and second ends of the second probe extend substantially parallel to a longitudinal axis of the second probe, the second end having first and second stems extending outwardly from the intermediate portion substantially parallel to a transverse axis of the second probe.

39. A system for testing an integrated circuit, the integrated circuit having a plurality of pins, each of the pins being configured to electrically communicate with a contact of a circuit assembly, the system comprising:

a frame defining an aperture and having a bottom surface, the bottom surface being configured to engage a circuit assembly and having a plurality of recesses formed therein, each of the recesses communicating with the aperture; and a plurality of test probes engaging the bottom surface, each of the probes being received, at least partially, within one of the recesses, each of the probes having a proximal end, a distal end, and an intermediate portion disposed between the proximal end and distal end, each distal end extending, at least partially, into the aperture such that each probe is engagable by a pin of an integrated circuit inserted into the aperture, at least of one of the probes having a longitudinal axis and a first laterally extending portion disposed along the intermediate portion of the probe, the proximal end at the intermediate portion of the at least one probe being located in a plane, the plane being oriented generally parallel to the bottom surface of the frame, the first laterally extending portion engaging a complimentary-shaped portion of the recess engaged by the probe, the first laterally extending portion of the probe and the complimentary-shaped portion of the recess being configured to reduce movement of the probe along the longitudinal axis of the probe as the pin of the integrated circuit engages the distal end of the probe.

40. The system of claim 39, wherein the probe has a second laterally extending portion, the first laterally extending portion and the second laterally extending portion residing on opposing sides of the longitudinal axis of the probe.

41. The system of claim 40, wherein the first laterally extending portion and the second laterally extending portion, as viewed in plan, are formed in an S-shaped configuration.

42. The system of claim 40, wherein the first laterally extending portion and the second laterally extending portion, as viewed in plan, are formed in a circular configuration.

* * * * *

UNITED STATES PATENT AND TRADEMARK OFFICE
CERTIFICATE OF CORRECTION

PATENT NO.    : 6,541,990 B1  
DATED         : April 1, 2003  
INVENTOR(S)   : James A. Migliaccio It is certified that error appears in the above-identified patent and that said Letters Patent is hereby corrected as shown below:

Column 10,
Line 17, after "claim", delete "34" and replace with -- 33 --.

Signed and Sealed this

Twelfth Day of August, 2003

JAMES E. ROGAN
*Director of the United States Patent and Trademark Office*